(12) United States Patent
Lee

(10) Patent No.: US 7,320,915 B2
(45) Date of Patent: Jan. 22, 2008

(54) METHOD OF MANUFACTURING FLASH MEMORY DEVICE

(75) Inventor: Seok Kiu Lee, Seongnam-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 461 days.

(21) Appl. No.: 11/139,059

(22) Filed: May 27, 2005

(65) Prior Publication Data

US 2006/0141718 A1   Jun. 29, 2006

(30) Foreign Application Priority Data

Dec. 28, 2004   (KR) .................. 10-2004-0114226

(51) Int. Cl.
*H01L 21/336* (2006.01)
(52) U.S. Cl. ................ 438/265; 438/595; 257/E21.209
(58) Field of Classification Search ................ 438/265, 438/594, 635, 657; 257/E21.209
See application file for complete search history.

(56) References Cited

U.S. PATENT DOCUMENTS 6,605,521 B2 * 8/2003 Ajmera et al. .............. 438/595
6,620,684 B2 * 9/2003 Kim et al. ................... 438/257

FOREIGN PATENT DOCUMENTS

| JP | 2000-232169 | 8/2000 |
|----|-------------|--------|
| JP | 2002-198446 | 7/2002 |
| KR | 2002-0095547 | 12/2002 |
| KR | 2004-0055174 | 6/2004 |

* cited by examiner

*Primary Examiner*—Chandra Chaudhari
(74) *Attorney, Agent, or Firm*—Marshall, Gerstein & Borun LLP

(57) ABSTRACT

The present invention relates to a method of manufacturing a flash memory device. According to the method of manufacturing the flash memory device, a gate line is formed to have a structure in which a tunnel oxide film, a polysilicon layer for floating gate, dielectric films and a polysilicon layer for a control gate are stacked, etch damages are compensated for by means of an oxidization process, and a metal layer formed on the polysilicon layer for control gate is formed by means of a damascene process. Accordingly, it is possible to sufficiently compensate for etch damages, prevent generation of abnormal oxidization in a metal layer, and improve the reliability of a process and electrical characteristics of a device accordingly.

11 Claims, 2 Drawing Sheets

METHOD OF MANUFACTURING FLASH MEMORY DEVICE

BACKGROUND

1. Field of the Invention

The present invention relates to a method of manufacturing a flash memory device, and more specifically, to a method of manufacturing a flash memory device in which a top layer of a gate line is comprised of a metal layer.

2. Discussion of Related Art

In DRAM/SRAM devices, stored information is lost if the supply of power is stopped. That is, in a DRAM, transistors that serve as a switch and capacitors that serve to store data constitute one cell. The DRAM is a volatile memory in which data stored in the cell is automatically lost if the supply of power is stopped. The SRAM is a volatile memory that has a transistor structure of a flip-flop type and stores data according to driving of the transistors.

On the contrary, a nonvolatile memory in which stored information is not lost although the supply of power is stopped has been developed by a developer participates in the management of a system in order to provide an operating system. The nonvolatile memory includes EPROM, EEPROM, flash EEPROM and so on. More particularly, recently, NAND type flash EEPROM has been spotlighted along with the explosive growth of mobile communication devices, MP3, digital camera, and the like.

In a manufacture process of all nonvolatile memory devices having a stack gate structure of a floating gate and a control gate, in the case where the design rule is 70 nm or less, common metal silicide (e.g., tungsten silicide) is not used as a top layer, but a metal layer (e.g., tungsten layer) has to be used due to a RC delay problem of a gate line.

In the case where the top layer of the gate line is formed of the metal layer, after the gate line is formed by means of a patterning process, an oxidization process is performed in selective oxidization mode in order to prevent abnormal oxidization of the metal layer when an oxide film is formed on sidewalls of the gate line. The selective oxidization process is a process of forming the oxide film on the sidewalls of the control gate and the floating gate while preventing abnormal oxidization from being generated in the metal layer.

If the selective oxidization process is performed, abnormal oxidization of the metal layer can be prevented, but it is implemented under a very limited condition. Thus, there are problems in that etch damages generated upon patterning of the gate line are not sufficiently compensated for, and the reliability for a tunnel oxide film is difficult to obtain.

SUMMARY OF THE INVENTION

Accordingly, the present invention has been made in view of the above problems, and it is an object of the present invention to provide a method of manufacturing a flash memory device, wherein etch damages can be sufficiently compensated for, generation of abnormal oxidization in a metal layer can be prevented, and the reliability of a process and electrical characteristics of a device can be improved accordingly, in such a manner that a gate line is formed to have a structure in which a tunnel oxide film, a polysilicon layer for floating gate, dielectric films and a polysilicon layer for a control gate are stacked, etch damages are compensated for by means of an oxidization process, and a metal layer formed on the polysilicon layer for control gate is formed by means of a damascene process.

To achieve the above object, according to an embodiment of the present invention, there is provided a method of manufacturing a flash memory device, including the steps of forming a gate line having a structure in which a tunnel oxide film, a first polysilicon layer, a dielectric film, a second polysilicon layer and a hard mask are stacked on a semiconductor substrate, compensating for etch damages by oxidizing sidewalls of the gate line by means of an oxidization process, forming an insulating film up to the height of the hard mask, removing the hard mask to form a damascene pattern on the second polysilicon layer, and forming a metal layer on the second polysilicon layer of the damascene pattern, wherein after the oxidization process is performed, the metal layer is formed, thereby preventing generation of abnormal oxidization in the metal layer.

In the above, the tunnel oxide film is preferably formed to a thickness of 50 Å to 150 Å using a silicon oxide film or a nitride oxide film.

The dielectric film can be formed to have the stack structure of an underlying oxide film/a nitride film/an upper oxide film. In this case, the underlying oxide film or the upper oxide film is preferably formed to a thickness of 30 Å to 100 Å by means of a thermal oxidization process or a Chemical Vapor Deposition (CVD) method. Further, the nitride film is preferably formed to a thickness of 30 Å to 80 Å by means of a CVD method. Meanwhile, the dielectric film can be formed using one of an aluminum oxide film, a zirconium oxide film and a hafnium oxide film, or is formed to have a stack structure in which at least one of the aluminum oxide film, the zirconium oxide film and the hafnium oxide film, is selectively combined with a silicon oxide film.

The hard mask can be formed of a material having a sufficient selectivity with oxide or polysilicon when the hard mask for forming the damascene pattern is removed. For example, the hard mask can be formed using a silicon nitride film.

The metal layer can be formed of a material having the resistant property against a subsequent process, such as heat-resistant property. For example, the metal layer can be formed using tungsten.

DETAILED DESCRIPTION OF PREFERRED EMBODIMENTS

Figure 1A:
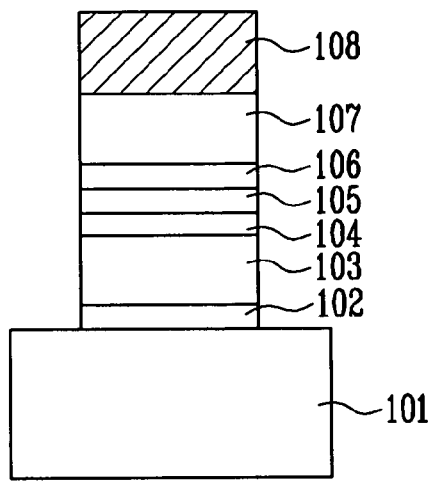
FIGS. 1a to 1e are cross-sectional views for explaining a method of manufacturing a flash memory device according to an embodiment of the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Furthermore, in the drawing, the thickness and size of each layer are exaggerated for convenience of explanation and clarity. Like reference numerals are used to identify the same or similar parts.

FIGS. 1a to 1e are cross-sectional views for explaining a method of manufacturing a flash memory device according to an embodiment of the present invention.

Referring to FIG. 1a, a gate line is formed on a semiconductor substrate 101 by means of a common process. In this case, the gate line is formed to have a structure in which a tunnel oxide film 102, a first polysilicon layer 103 for floating gate, dielectric films 104 to 106, and a second polysilicon layer 107 for control gate are stacked. A hard mask 108, which is used as an etch mask in a patterning process for forming the gate line, is then formed on the second polysilicon layer 107.

In this case, the tunnel oxide film 102 can be formed using a silicon oxide film or a nitride oxide film, and can be formed to a thickness of 50 to 150 Å.

The dielectric films 104 to 106 can be formed to have the stack structure of the oxide film 104/the nitride film 105/the oxide film 106. In this case, the underlying oxide film 104 and the upper oxide film 106 can be formed to a thickness of 30 to 100 Å by means of a thermal oxidization process or a CVD method. Furthermore, the nitride film 105 can be formed to a thickness of 30 to 80 Å by means of a CVD method. The dielectric film can be formed by using one of an aluminum oxide film, a zirconium oxide film and a hafnium oxide film, or is formed to have a stack structure in which at least one of the aluminum oxide film, the zirconium oxide film and the hafnium oxide film, is selectively combined with a silicon oxide film, instead of the stack structure of the oxide film 104/the nitride film 105/the oxide film 106.

The hard mask 108 can be formed using a silicon nitride film. As a thickness of a metal layer to be formed on the second polysilicon layer 107 is decided according to a thickness of the hard mask 108 in a subsequent process, the hard mask 108 is formed to a proper thickness in consideration of the above fact.

Meanwhile, though not shown in the drawings, an isolation film is formed in an isolation region of the semiconductor substrate 101, and source/drain is formed in an active region thereof.

A different between the above structure and the convention one lies in that the metal layer is not formed on the second polysilicon layer 107.

Figure 1B:
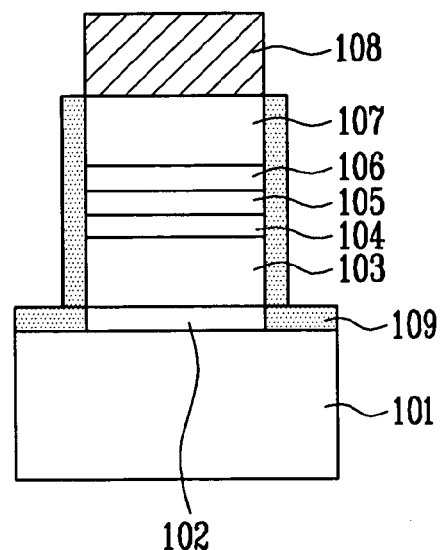

Referring to FIG. 1b, in order to mitigate etch damages generated in the patterning process for forming the gate line and to improve electrical characteristics of a device, an oxidization process is performed. A thin oxide film 109 is formed on the sidewalls of the gate lines 102 to 107 by means of the oxidization process. In this case, since the oxidization process is carried out with the metal layer not being formed, there is no need to worry about generation of abnormal oxidization in the metal layer. Accordingly, since the oxidization process can be performed with some leeway, it is possible to sufficiently compensate for etch damages generated upon patterning of the gate line and also to secure reliability for the tunnel oxide film.

Figure 1C:
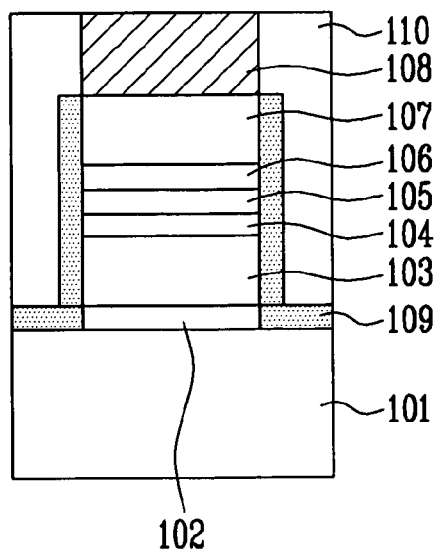

Referring to FIG. 1c, an insulating film 110 is formed up to the height of the hard mask 108. The insulating film 110 can be formed using a silicon oxide film. Meanwhile, the insulating film 110 can be formed by forming the silicon oxide film on the entire structure in a thickness that is thick enough to cover up to the hard mask 108 and then allowing the silicon oxide film to remain up to the height of the hard mask 108 by means of a blanket etch process or a CMP (Chemical Mechanical Polishing) process.

Figure 1D:
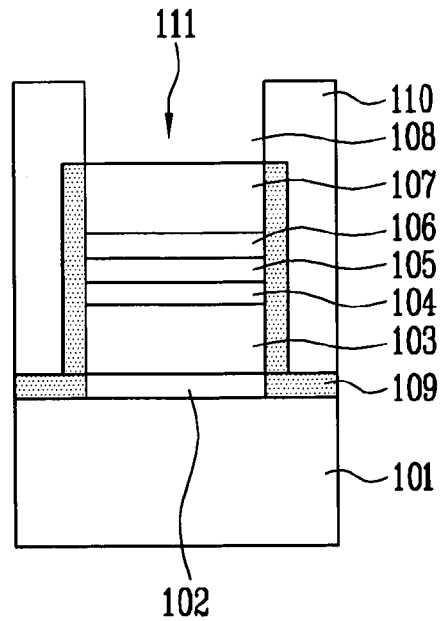

Referring FIG. 1d to, the hard mask (108 of FIG. 1c) on the second polysilicon layer 107 is removed, thereby forming a damascene pattern 111 on the second polysilicon layer 107.

Figure 1E:
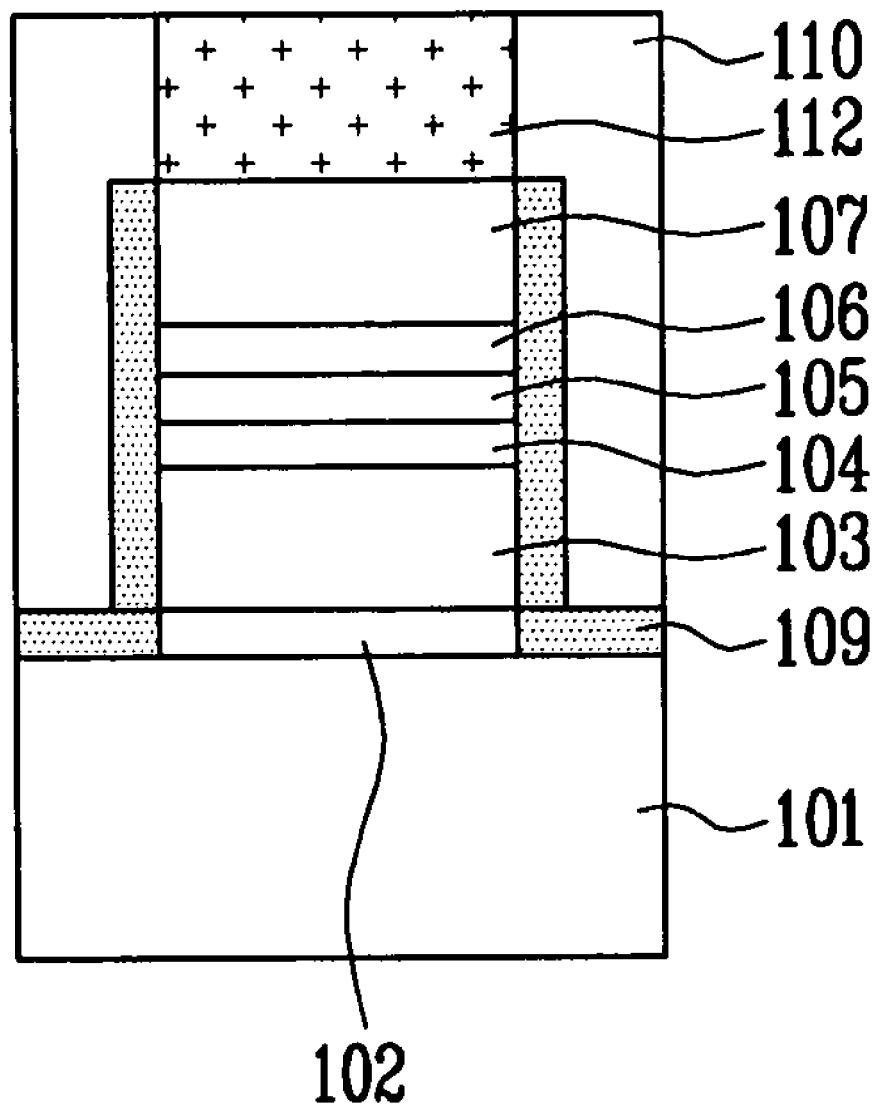

Referring to FIG. 1e, a metal layer 112 is formed in the damascene pattern (111 of FIG. 1d). The metal layer 112 is preferably formed using tungsten. Meanwhile, the metal layer 112 can be formed by forming the metal film on the entire structure in a thickness that is thick enough to completely cover the damascene pattern (111 of FIG. 1d) and then allowing the tungsten layer to remain only within the damascene pattern (111 of FIG. 1d) by means of a blanket etch process or a CMP (Chemical Mechanical Polishing) process. Thereby, the gate line in which the metal layer 112 is formed in the top layer is completely formed.

As described above, according to a method of manufacturing a flash memory device in accordance with the present invention, a gate line is formed to have a structure in which a tunnel oxide film, a polysilicon layer for floating gate, dielectric films and a polysilicon layer for a control gate are stacked, etch damages are compensated for by means of an oxidization process, and a metal layer formed on the polysilicon layer for control gate is formed by means of a damascene process. Accordingly, the present invention is advantageous in that it can sufficiently compensate for etch damages, prevent generation of abnormal oxidization in a metal layer, and improve the reliability of a process and electrical characteristics of a device accordingly.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a flash memory device, comprising the steps of:
   forming a gate line having a structure in which a tunnel oxide film, a first polysilicon layer, a dielectric film, a second polysilicon layer and a hard mask are stacked on a semiconductor substrate;
   compensating for etch damages by oxidizing sidewalls of the gate line by means of an oxidization process;
   forming an insulating film up to the height of the hard mask;
   removing the hard mask to form a damascene pattern on the second polysilicon layer; and
   forming a metal layer on the second polysilicon layer of the damascene pattern,
   wherein after the oxidization process is performed, the metal layer is formed, thereby preventing generation of abnormal oxidization in the metal layer.

2. The method as claimed in claim 1, wherein the tunnel oxide film is formed to a thickness of 50 Å to 150 Å using a silicon oxide film or a nitride oxide film.

3. The method as claimed in claim 1, wherein the dielectric film is formed to have the stack structure of an underlying oxide film/a nitride film/an upper oxide film.

4. The method as claimed in claim 3, wherein the underlying oxide film or the upper oxide film is formed to a thickness of 30 Å to 100 Å by means of a thermal oxidization process or a Chemical Vapor Deposition (CVD) method.

5. The method as claimed in claim 3, wherein the nitride film is formed to a thickness of 30 Å to 80 Å by means of a Chemical Vapor Deposition (CVD) method.

6. The method as claimed in claim 1, wherein the dielectric film is formed using one of an aluminum oxide film, a zirconium oxide film and a hafnium oxide film, or is formed to have a stack structure in which at least one of the aluminum oxide film, the zirconium oxide film and the hafnium oxide film, is selectively combined with a silicon oxide film.

7. The method as claimed in claim 1, wherein the hard mask is formed of a material having a sufficient selectivity with oxide or polysilicon when the hard mask for forming the damascene pattern is removed.

8. The method as claimed in claim 7, wherein the hard mask is formed of a silicon nitride film.

9. The method as claimed in claim 1, wherein the metal layer is formed of a material having a resistant property against a subsequent process.

10. The method as claimed in claim 9, wherein the metal layer is formed of a material having a heat-resistant property.

11. The method as claimed in claim 10, wherein the metal layer is formed of tungsten.

* * * * *